United States Patent [19]

Hastie et al.

[11] Patent Number: 5,418,480
[45] Date of Patent: May 23, 1995

[54] LOGIC CELL USING ONLY TWO N TYPE TRANSISTORS FOR GENERATING EACH LOGIC FUNCTION

[75] Inventors: Neil S. Hastie; David A. Williams, both of Plymouth, United Kingdom

[73] Assignee: Plessey Semicondcutors Limited, Wiltshire, United Kingdom

[21] Appl. No.: 68,200

[22] Filed: May 28, 1993

[30] Foreign Application Priority Data

Jun. 2, 1992 [GB] United Kingdom ................ 9211678
Jan. 12, 1993 [GB] United Kingdom ................ 9300449

[51] Int. Cl.$^6$ .......................................... H03K 19/094
[52] U.S. Cl. ....................................... 326/113; 327/408
[58] Field of Search ................ 307/443, 448, 449, 451, 307/468, 243

[56] References Cited

U.S. PATENT DOCUMENTS

| | | | |
|---|---|---|---|
| 4,633,220 | 12/1986 | Burgess | 307/449 |
| 4,893,031 | 1/1990 | Masuda | 307/451 |
| 5,079,446 | 1/1992 | Hölzle | 307/243 X |
| 5,144,166 | 9/1992 | Camarota et al. | 307/465.1 |
| 5,245,227 | 9/1993 | Furtek et al. | 307/243 X |

FOREIGN PATENT DOCUMENTS 0187697  7/1986  European Pat. Off. .
1595597  8/1981  United Kingdom .

Primary Examiner—David R. Hudpseth
Attorney, Agent, or Firm—Spencer, Frank & Schneider

[57] ABSTRACT

A programmable logic cell has two inputs and six outputs, each output being a different logical function of the inputs. Each output is generated by a pair of NMOS transistors, one transistor of each pair having its gate connected to one of the inputs and the other transistor of each pair having its gate connected to the inverse of the same input.

5 Claims, 4 Drawing Sheets

LOGIC CELL USING ONLY TWO N TYPE TRANSISTORS FOR GENERATING EACH LOGIC FUNCTION

BACKGROUND OF THE INVENTION

This invention relates to a programmable logic cell and particularly to a programmable logic cell for use in a programmable gate array.

Programmable gate arrays comprise a large number of logic cells linked together by a routing network.

In general each logic cell has n inputs and k outputs, the k outputs being provided as inputs to a k to 1 multiplexor. However it is often advantageous to have a single output from the logic cell, so the logic cell may incorporate a multiplexor to provide a single output. Further multiplexors are provided to allow the logic cells to be linked up as required to allow their individual logic functions to be built up into a complex program by linking the output of each logic cell to the input of another in an appropriate manner.

A problem in programmable gate arrays is that they generally require data to travel through a very large number of logic cells in series and as a result the delay between data being supplied to the array and coming from the array can be unacceptably long.

In order to overcome this problem it is desirable to minimise the time delay imposed by each individual logic cell.

This invention is intended to provide a logic cell having the smallest possible delay in order to overcome this problem.

SUMMARY OF THE INVENTION

This invention provides a logic cell having first and second inputs and a plurality of outputs and comprising a pair of inverters, one associated with each input, and a pair of NMOS transistors associated with each output, one transistor of each pair having its gate connected to the second input without inversion and the second transistor of each pair having its gate connected to the second input after inversion by its associated inverter.

This minimises the time delay imposed by the logic cell to the delay of one inverter and one N-type transistor and also minimises the area of silicon required to implement the logic cell as an integrated circuit.

The logic cell generates all of its available functions in parallel and provides them all to the multiplexor. The selection of which function is given as an output is carried out by an associated multiplexor in response to its control signals.

BRIEF DESCRIPTION OF THE DRAWINGS

Devices embodying the invention will now be described by way of example only with reference to the accompanying diagrammatic Figures in which.

DETAILED DESCRIPTION OF THE PREFERRED EMBODIMENTS

Figure 1:
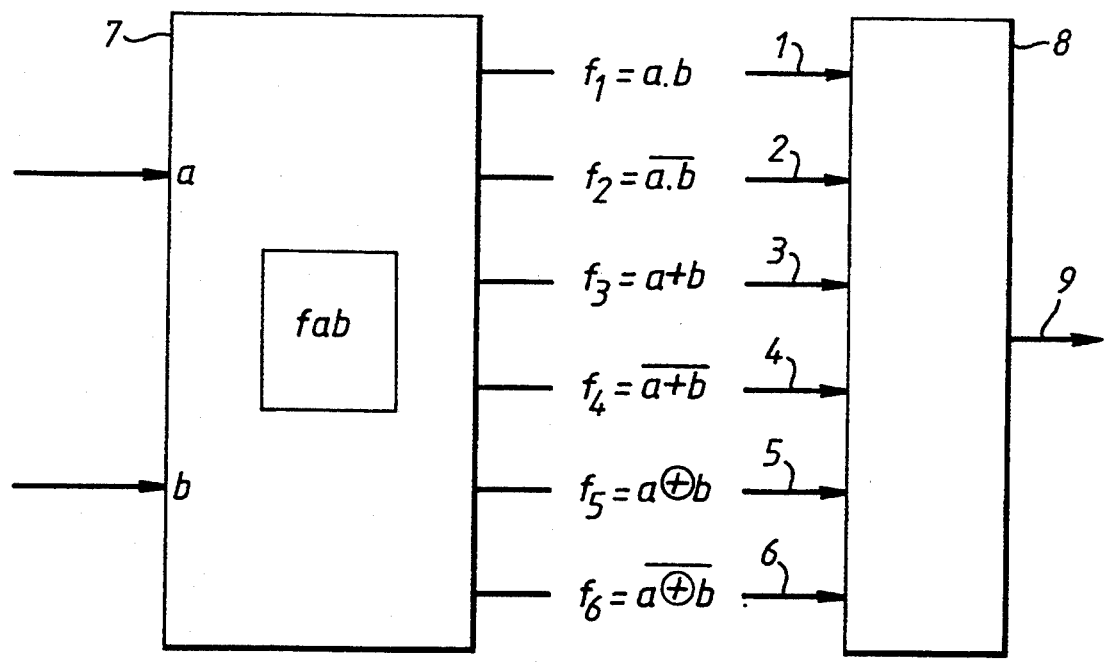
FIG. 1 shows a general view of a logic cell employing the invention.
Figure 2:
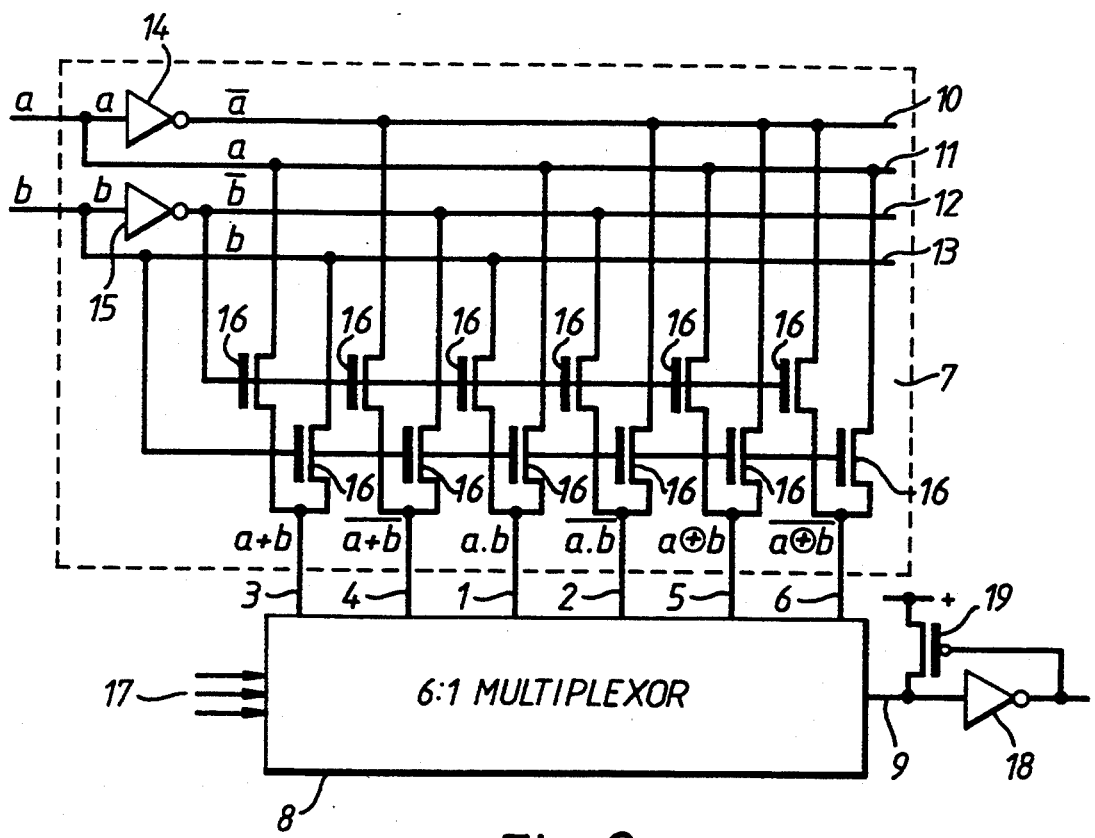
FIG. 2 shows the internal circuitry of the logic cell of FIG. 1.

Referring to FIG. 1, a logic cell 7 having two inputs a and b and six outputs 1 to 6 is shown. Associated with this logic cell 7 is a 6 to 1 multiplexor 8 with a single output 9. The logic cell 7 generates the six basic logic functions in parallel, one logic function on each of the lines 1 to 6, for whatever inputs are present on inputs a and b. The logical output $f_1$ to $f_6$ on lines 1 to 6, respectively, are as follows;

$f_1 = a.b$ $f_2 = \overline{a.b}$ $f_3 = a+b$ $f_4 = \overline{a+b}$ $f_5 = a \oplus b$ $f_6 = \overline{a \oplus b}$ The internal circuitry of the logic cell is shown in detail in FIG. 2, where the multiplexor is not shown in detail but a preferred form of multiplexor is that described in our co-pending patent application, the contents of which are included herein by way of reference.

Referring to FIG. 2, the logic cell 7 has inputs a and b which are linked to four rails 10,11,12 and 13. The signal on input a is supplied directly to rail 11 and through an inverter 14 to rail 10, while the signal on input b is supplied directly to rail 13 and through an inverter 15 to rail 12.

Each of the logic functions $f_1$ to $f_6$ on output lines 1 to 6 of the logic cell 7 is produced using two NMOS transistors 16 connected to the rails 10 to 13.

Each pair of NMOS transistors 16 have their outputs combined to generate the output to a respective one of the lines 1–6. The NMOS transistors are arranged such that only one of them is switched on at any given time. This is done by the gates of one of each pair being connected to the b input on rail 13 while the gate of the other NMOS transistor in each pair is connected to the b inverted input on rail 12. As a result only one transistor in each pair can be switched on at any time.

It is well known that each of the six logic functions produced by the logic cell 7 can be produced by two transistors linked to two inputs or the corresponding inverted inputs, so it is not necessary to explain the functioning of each pair of NMOS transistors 16 generating each of the logic functions in detail.

The six outputs from output lines 1 to 6 from the logic cell 7 are supplied to the 6 to 1 multiplexor 8 which supplies one of them onto an output line 9. Thus, the logic cell 7 always produces all 6 logic outputs and the logic output actually supplied to other elements in the gate array is selected by the multiplexor 8 in response to the function select signals provided on control lines 17 of multiplexor 8. These signals can either be provided by a fuse or antifuse type of system and be unchangeable or could be provided by a RAM memory and thus be changeable as desired in order to change the programming of the gate array as a whole. Other methods of supplying the function select signals could also be used.

In order to ensure that the output from the multiplexor 8 is a full rail to rail voltage swing, an inverter 18 is provided on the output line 9 of the multiplexor.

A feed back P type transistor 19 is used in conjunction with the inverter 18 in order to minimise static power dissipation within the inverter 18.

This logic cell design reduces both the silicon area and the delay on data passing through the cell by reducing each logic function to only two N type transistors and by minimising the number of delays to one inverter delay and one N type transistor delay.

Although additional delays will be introduced by the multiplexor 8 and its output inverter 18, these delays are unavoidable and are dependant on the type of multiplexor used.

Although a logic cell shown in FIG. 2 is very quick, the usefulness of the logic cell can be considerably increased by adding a 2 to 1 multiplexor as a seventh output. This will of course require a third control input to decide whether the 2 to 1 multiplexor passes signal a or signal b.

Figure 3:
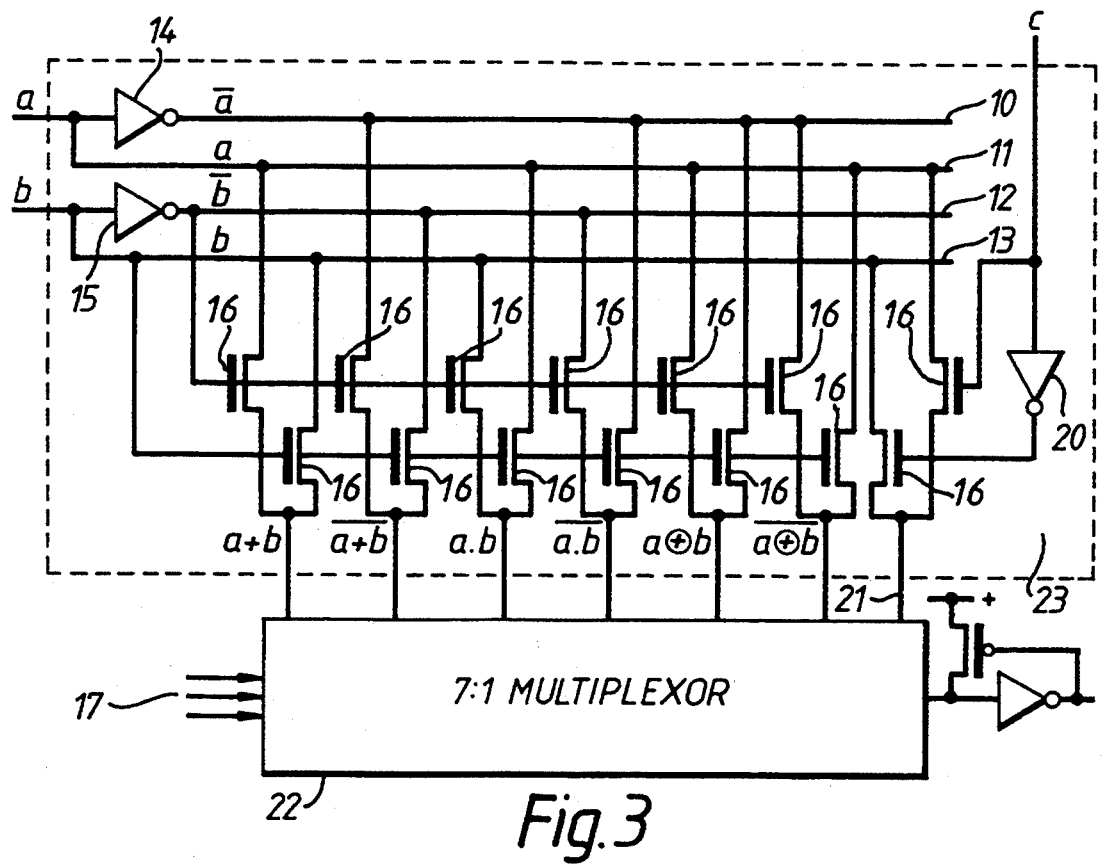
FIG. 3 shows an alternative logic cell employing the invention.

Such a logic cell is shown in FIG. 3. This is similar to the logic cell in FIG. 2, the only difference being that the un-inverted a and b inputs on rails 11 and 13 are each linked to one of a pair of NMOS transistors 16 forming a 2 to 1 multiplexor. The two NMOS transistors 16 forming the 2 to 1 multiplexor are controlled by a third control input c which is supplied directly to the gate of one of the NMOS transistors 16 forming the 2 to 1 multiplexor and is supplied to the gate of the other NMOS transistor 16 forming the multiplexor after being inverted by an inverter 20. The output of the two multiplexor NMOS transistors 16 is provided as a seventh output 21 from the logic cell 23. Since there are now seven outputs from the logic cell 23 a 23 to 1 multiplexor 22 is used instead of the 6 to 1 multiplexor 8.

This increases the complexity and silicon area of the logic cell, but does not increase its delay time which still the delays of one N type transistor and one inverter.

Figure 4:
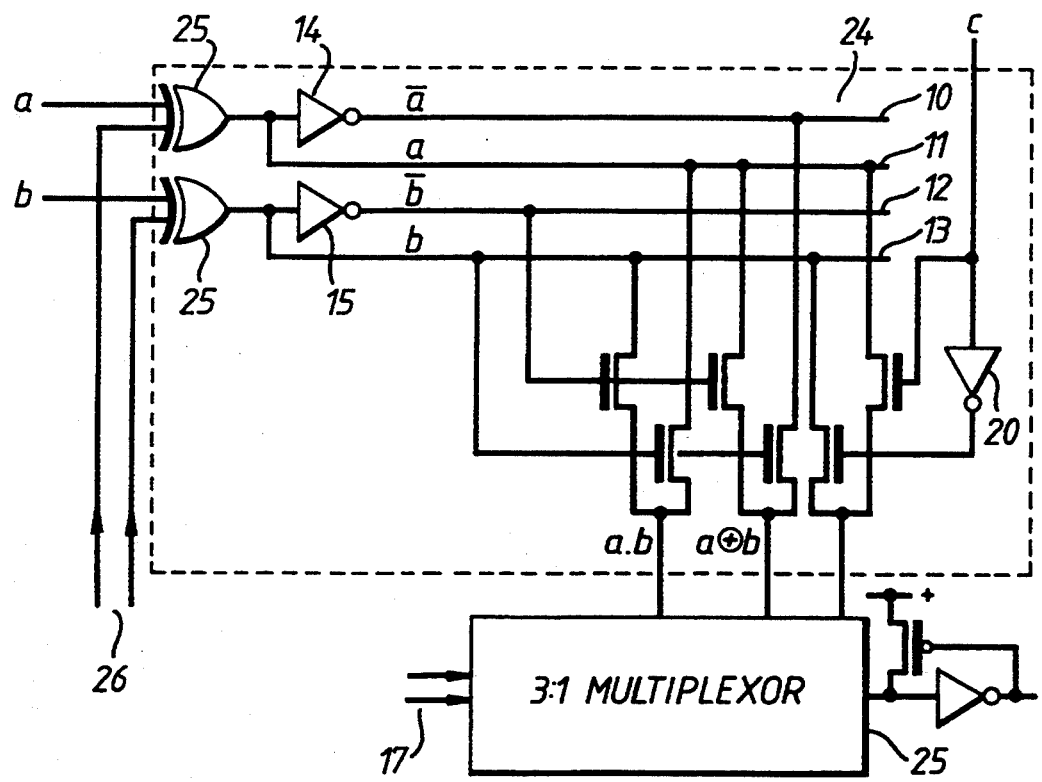
FIG. 4 shows another alternative logic cell employing the invention.

In some situations a more complex logic cell is required which is capable of producing all possible logical outputs of two inputs. One such logic cell 24 is shown in FIG. 4. In this logic cell 24 the inputs a and b are each supplied to one input of an exclusive or (XOR) gate 25. The other input of each of the XOR gates 25 is supplied as a function select signal along lines 26, thus allowing selective inversion of either or both inputs a and b. The outputs of the XOR gates 25 are then treated in the same way as the a and b inputs in the previous logic cells, having their inverted and non-inverted values provided on rails 10 to 13. The rails 10 to 13 are connected to two logic gates, an a.b and an a+b each formed by a pair of NMOS transistors. The a and b inputs are also supplied to a 2 to 1 multiplexor formed by two NMOS transistors which are controlled by a third input c and an inverter 20 as before. The three outputs from the logic cell 24 are supplied to a 3 to 1 multiplexor 25 which is controlled by control inputs along lines 17.

The list of all possible logic functions which can be generated by this logic cell are:

$$f = a \cdot b \qquad f = \overline{a} \cdot b$$
$$f = \overline{a \cdot b} \qquad f = a \cdot \overline{b}$$
$$f = a + b \qquad f = \overline{a} + b$$
$$f = \overline{a + b} \qquad f = a + \overline{b}$$
$$f = a \oplus b \qquad f = \overline{a \oplus b}$$

and in addition the logic cell can operate as a 2 to 1 multiplexor. The control logic setting the function produced by the logic cell controls the XOR gates 25 as well as the multiplexor.

Although this logic cell is capable of carrying out more logic functions than the other earlier devices it does have a longer delay because of the addition of the XOR gates. As a result, although this cell may be advantageous for gate arrays using combinational logic, it is likely to be less useful than the earlier cell for gate arrays employing sequential logic.

A further feature which may be desirable in some circumstances is for each logic cell to be capable of having its output fed back to provide one of its inputs so as to form a data latch.

Figure 5:
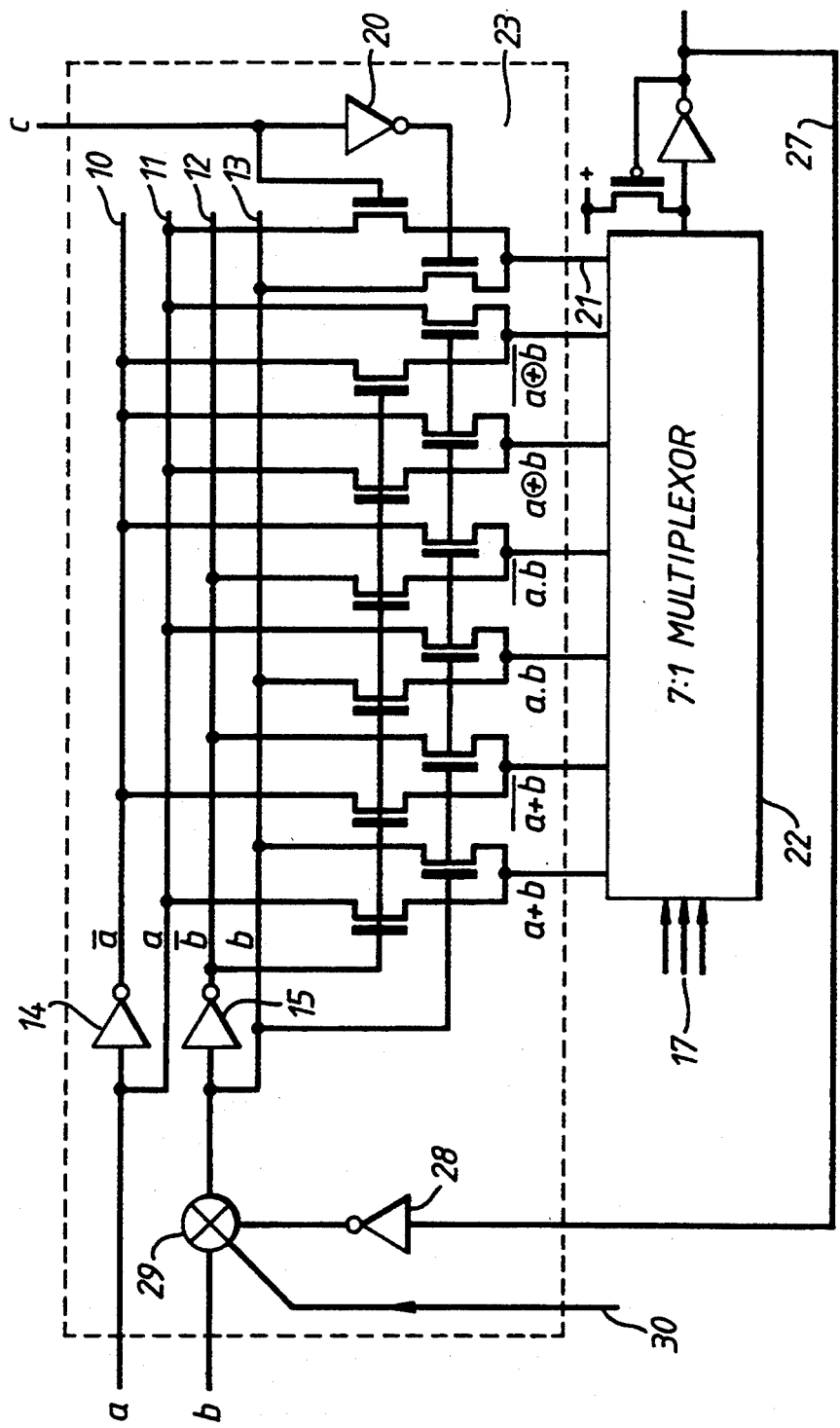
FIG. 5 shows a further alternative logic cell employing the invention.
Figure 6:
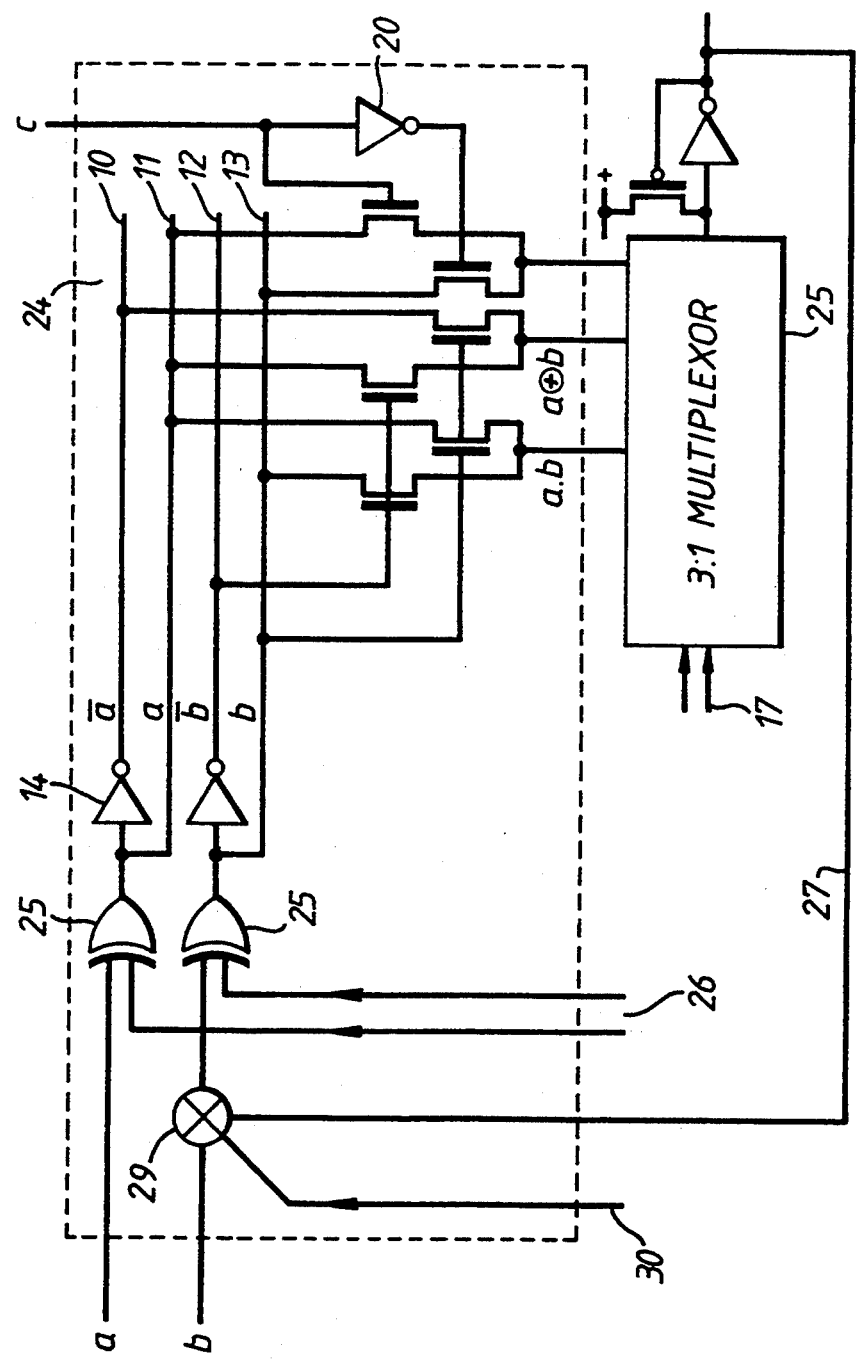
FIG. 6 shows yet another alternative logic cell employing the invention, identical parts having the same reference numerals throughout.

FIGS. 5 and 6 show logic cells equivalent to those shown in FIGS. 3 and 4 but with this feature added.

Referring to FIG. 5 the output from the 7 to 1 multiplexor 22 is returned by a feed back line 27 and an inverter 28 to one input of a 2 to 1 multiplexor 29. The other input of the 2 to 1 multiplexor 29 is the b input to the logic cell. The output of the 2 to 1 multiplexor 29 is treated in the same way as the direct b input would have been in the logic cell of FIG. 3 to generate the signals on rails 12 and 13. Whether the 2 to 1 multiplexor 29 passes the direct input b or the fed back output to the rest of the logic cell is controlled by an input on a line 30.

Referring to FIG. 6 the output from the 3 to 1 multiplexor 25 is returned by a feed back line 27 to one input of a 2 to 1 multiplexor 29. The other input of the 2 to 1 multiplexor 29 is the b input to the logic cell. The output of the 2 to 1 multiplexor 29 is treated in the same way as the direct b input would have been in the logic cell of FIG. 4 to generate the signals on rails 12 and 13. Whether the direct b input or the fed back output is supplied by the 2 to 1 multiplexor 29 to the rest of the logic cell is controlled by an input on a line 30.

In the logic cell of FIG. 5 the inverter 28 is included in the feed back line 27 to ensure that there is no phase change in the loop formed by the cell when operating as a data latch. The inverter 28 is not needed in the system of FIG. 6 because the XOR gate 25 to which the b input is supplied can be set to invert data passing through it when required by the input on the appropriate line 26, so the use of a dedicated inverter is not required.

It would of course be possible to have a gate array employing cells of several different types so as to make best use of their various strengths and weaknesses.

We claim:

1. A logic cell, comprising:
 first, second and third inputs for receiving first, second and third input signals, respectively;
 first and second inverters coupled to the first and second inputs for producing first and second inverted input signals, respectively;
 a plurality of pairs of NMOS transistors, each NMOS transistor having a gate electrode, an input electrode and an output electrode, the gate electrode of one NMOS transistor of each said pair being coupled for directly receiving the second input signal and the other NMOS transistor of each said pair being coupled for receiving the second inverted input signal, the output electrodes of each said pair being connected together so that each pair of NMOS transistors has a common output, each input electrode of the NMOS transistors being coupled in a predetermined manner for receiving one of the first, second, inverted first and inverted second input signals for producing a different logical output signal on the respective common outputs of the NMOS transistor pairs; and a further pair of NMOS transistors arranged to form a 2 to 1 multiplexor having a control input constituting the third input for receiving the third input signal, the 2 to 1 multiplexor having inputs coupled for receiving the first and second input signals and an output, the 2 to 1 multiplexor producing one of the first and second input signals on its output in response to the third input signal.

2. A logic cell as claimed in claim 1, and further comprising a second multiplexor having a plurality of inputs and a number of outputs, the inputs of said second multiplexor being coupled, respectively, for receiving the logical output signals on the common outputs of the NMOS transistor pairs and the signal on the output of the 2 to 1 multiplexor.

3. A logic cell as claimed in claim 1, wherein the number of outputs of the second multiplexor is one.

4. A logic cell as claimed in claim 2, wherein the logic cell includes an additional input and the second multiplexor has an output that is coupled to the additional input for feeding back an output signal of the additional multiplexor to the additional input of the logic cell.

5. A logic cell as claimed in claim 4, and further comprising a third multiplexor having a control input for receiving a control signal, a first input for receiving the fed back output signal of the second multiplexor, a second input for receiving the second input signal to the logic cell, and an output for producing one of the fed back signal and the second input signal as an output signal in response to the control signal on the control input of the third multiplexor, the output of the third multiplexor constituting the second input of the logic cell.

* * * * *